(12) United States Patent
Lee

(10) Patent No.: US 11,817,230 B1
(45) Date of Patent: Nov. 14, 2023

(54) DEVICE FOR EUV LIGHT SOURCE

(71) Applicant: ESOL Inc., Hwaseong-si (KR)

(72) Inventor: Dong Gun Lee, Hwaseong-si (KR)

(73) Assignee: ESOL Inc., Hwaseong-si (KR)

( * ) Notice: Subject to any disclaimer, the term of this patent is extended or adjusted under 35 U.S.C. 154(b) by 60 days.

(21) Appl. No.: 17/833,902

(22) Filed: Jun. 7, 2022

(30) Foreign Application Priority Data

May 10, 2022 (KR) .................. 10-2022-0057441

(51) Int. Cl.
*G21K 1/06* (2006.01)
*G02B 5/08* (2006.01)
*G02B 5/10* (2006.01)
*H05G 2/00* (2006.01)

(52) U.S. Cl.
CPC ............ *G21K 1/06* (2013.01); *G02B 5/0891* (2013.01); *G02B 5/10* (2013.01); *H05G 2/008* (2013.01)

(58) Field of Classification Search
CPC .......... G21K 1/06; G02B 5/0891; G02B 5/10; H05G 2/008

USPC ..................................... 250/504 R
See application file for complete search history.

(56) References Cited

U.S. PATENT DOCUMENTS

| 2010/0090133 A1* | 4/2010 | Endo | ..................... | H05G 2/00 |
| | | | | 250/493.1 |
| 2010/0176310 A1* | 7/2010 | Moriya | .................. | G03F 7/7085 |
| | | | | 250/493.1 |

* cited by examiner

*Primary Examiner* — Kiet T Nguyen
(74) *Attorney, Agent, or Firm* — Revolution IP, PLLC

(57) ABSTRACT

The present invention relates to an EUV light generation device including: a laser beam irradiated on a target material droplet; and a focusing mirror for focusing the EUV light generated through the plasma emitted by means of the irradiation of the laser beam on the droplet, wherein the focusing mirror has a concaved operating surface and a focusing point formed at a position facing the operating surface, and the laser beam and a focusing lens for focusing the laser beam are located at the positions facing the operating surface of the focusing mirror, so that the focusing point, the laser beam, and the focusing lens are located on the positions facing the operating surface, that is, on one side of the operating surface.

5 Claims, 3 Drawing Sheets

DEVICE FOR EUV LIGHT SOURCE

BACKGROUND OF THE INVENTION

Cross Reference to Related Application of the Invention

The present application claims the benefit of Korean Patent Application No. 10-2022-0057441 filed in the Korean Intellectual Property Office on May 10, 2022 the entire contents of which are incorporated herein by reference.

Field of the Invention

The present invention relates to a device for generating extreme ultraviolet (hereinafter referred to as EUV) light adequate for blank inspection equipment, and more specifically, to an EUV light generation device that is capable of providing EUV light having high brightness through a light source with a small size advantageous to a blank inspection device.

Further, the present invention relates to an EUV light generation device that is capable of providing EUV light having high brightness through a light source with a small size, while being continuously available.

Background of the Related Art

A method for producing EUV light is carried out by irradiating a laser beam on a target material having a line-emitting element, in a method including the step of converting the target material into a state of plasma having at least one element having one or more emission lines in an EUV range, such as xenon, lithium, and tin, so that a required plasma which is sometimes called 'laser-produced plasma (LPP) is generated.

A specific LPP technology includes the irradiation of a main pulse on a target material droplet by means of one or more pre-pulses subsequent to the main pulse. In this respect, a $CO_2$ laser provides specific advantages when a drive laser creates a main pulse in an LPP process. This can be true to a specific target material such as a molten tin droplet. For example, one of the advantages is a relatively high conversion efficiency, for example, the function of calculating the ratio of the power in-band of EUV to drive laser input power.

FIG. 1 shows a conventional EUV light generation device, and referring to FIG. 1, for example, a laser-produced plasma EUV light source 20 is schematically shown. As shown, the LPP light source 20 includes a system 22 for producing an optical pulse train to transfer optical pulses to a chamber 26. The respective optical pulses move to the chamber 26 along a beam path produced from the system 22 so that they are irradiated on target droplets on an irradiation field 28, which will be discussed below.

A laser adequate for the system 22 as shown in FIG. 1 may be pulsed laser device such as a gas-discharge $CO_2$ laser device that operates at a pulse higher than 50 kHz or at relatively high power such as 10 kHz to thus produce DC-excited or RF-excited radiation at 9.3 or 10.6 μm.

So as to produce a plasma and achieve EUV emission, as shown in FIG. 1, the EUV light source 20 further includes a target material transfer system 24 for transferring a target material droplet to the irradiation field 28 in the interior of the chamber 26 where one or more optical pulses such as one or more pre-pulses and one or more main pulses subsequent to the pre-pulses and the droplet interact with one another.

The target material droplet may include tin, lithium, xenon, or a combination thereof, but it may not be limited necessarily thereto. The elements for emitting EUV light such as tin, lithium, xenon, and the like may have the forms of liquid droplets and/or solid particles contained in the liquid droplets.

Further referring to FIG. 1, the EUV light source 20 further includes an optical instrument 30 such as a collector mirror that has alternating molybdenum and silicon layers to the shape of a truncated oval with graded multiple coatings. As shown in FIG. 1, further, the optical instrument 30 has an aperture 32 for allowing the optical pulses produced from the system 22 to pass therethrough so that the optical pulses reach the irradiation field 28. As shown, the optical instrument 30 may be an oval mirror having a first focus within the irradiation field 28 or close thereto and a second focus 40 within a given intermediate field, and in this case, the EUV light is produced from the EUV light source 20 and transferred to a device utilizing the EUV light, such as an integrated circuit lithography tool (not shown). Another optical equipment may be used at the position of the oval mirror for collecting the light to transmit the collected light to the intermediate field so that the light is transferred to the device utilizing the EUV light, and for example, the optical equipment transfers the laser beam having a parabola or ring-shaped section to the intermediate field.

Further referring to FIG. 1, the EUV light source 20 includes an EUV controller 60 having an ignition control system for triggering one or more lamps and/or laser devices in the system 22 to produce the optical pulses that are transferred to the chamber 26.

To perform accurate inspection through a blank mask inspection device, EUV light with high brightness has to be produced from a light source small in size.

However, as shown in FIGS. 1 and 2, the conventional EUV light generation device has to have the aperture 32 formed on the collector mirror 30 as the optical instrument so as to allow the optical pulses produced from the system 22 to pass through the collector mirror 30 and reach the irradiation field 28.

Further, there is a limitation in increasing the size of the aperture 32 so as to prevent the focusing efficiency of the collector mirror 30 when the EUV light produced through the reaction with the droplet is focused on the second focus 40 from being lowered, and accordingly, it is difficult in increasing the numerical aperture (NA) of the beam irradiated on the irradiation field 28 after the beam has passed through the collector mirror.

It can be therefore appreciated that the conventional EUV light generation device has some limitations in producing EUV light with high brightness, while being small in size advantageous to a blank inspection device.

SUMMARY OF THE INVENTION

Accordingly, the present invention has been made in view of the above-mentioned problems occurring in the related art, and it is an object of the present invention to provide an EUV light generation device that is capable of providing EUV light having high brightness, while being small in size advantageous to a blank inspection device.

It is another object of the present invention to provide an EUV light generation device that is capable of providing EUV light having high brightness, while being small in size and being continuously available.

To accomplish the above-mentioned objects, according to the present invention, there is provided an EUV light generation device including: a laser beam irradiated on a target material droplet; and a focusing mirror for focusing the EUV light generated through the plasma emitted by means of the irradiation of the laser beam on the droplet, wherein the focusing mirror has a concaved operating surface and a focusing point formed at a position facing the operating surface, and the laser beam and a focusing lens for focusing the laser beam are located at the positions facing the operating surface of the focusing mirror, so that the focusing point, the laser beam, and the focusing lens are located on the positions facing the operating surface, that is, on one side of the operating surface.

According to the present invention, desirably, the focusing mirror may be disposed on one side of the droplet, while the focusing lens being disposed on the other side opposite to one side of the droplet, so that as the laser beam moves forward to the form of reduced light in one direction and is thus focused, the laser beam goes straight, passes through the focusing lens, and reaches a point at which the droplet is located, and after the laser beam reaches the droplet, plasma emission is performed through the reaction between the laser beam and the droplet, so that the EUV light generated through the plasma emission is incident on the operating surface, reflected in the opposite direction to the incident direction through the operating surface, and focused on the focusing point.

According to the present invention, desirably, if it is assumed that an optical axis connecting the center of the focusing lens and the first focus at which the droplet is located is an A-axis, a point where the operating surface and the A-axis meet each other is a contact point, and a connection axis connecting the contact point and the focusing point is a B-axis, an angle between the A-axis and the B-axis is in the range of 10 to 70°.

According to the present invention, desirably, between the operating surface and the first focus at which the droplet is located is disposed a protection plate for protecting the operating surface from the laser beam to prevent the operating surface from being damaged due to the laser beam after the laser beam reaches the droplet to the form of the reduced light whose sectional size becomes gradually decreased by means of the focusing lens and is then incident on the operating surface to the form of enlarged light whose sectional size becomes gradually increased.

According to the present invention, desirably, the protection plate may be constituted of multiple layers, and among the multiple layers, one layer may include a carbon nanotube (CNT) or graphene, while another layer including one or more elements of zirconium (Zr), molybdenum (Mo), aluminum (Al), and niobium (Nb).

According to the present invention, desirably, if it is assumed that a center axis vertical to the center point in area of the opposite surface to the operating surface of the focusing mirror is a C-axis, the operating surface of the focusing mirror has a non-spherical shape, so that the focusing point generated through the operating surface is located at one side of the C-axis.

According to the present invention, desirably, the first focus at which the droplet is located is disposed on the opposite side to the focusing point with respect to the C-axis, so that the first focus and the focusing point are located on both sides of the C-axis.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE EMBODIMENTS

Figure 1:
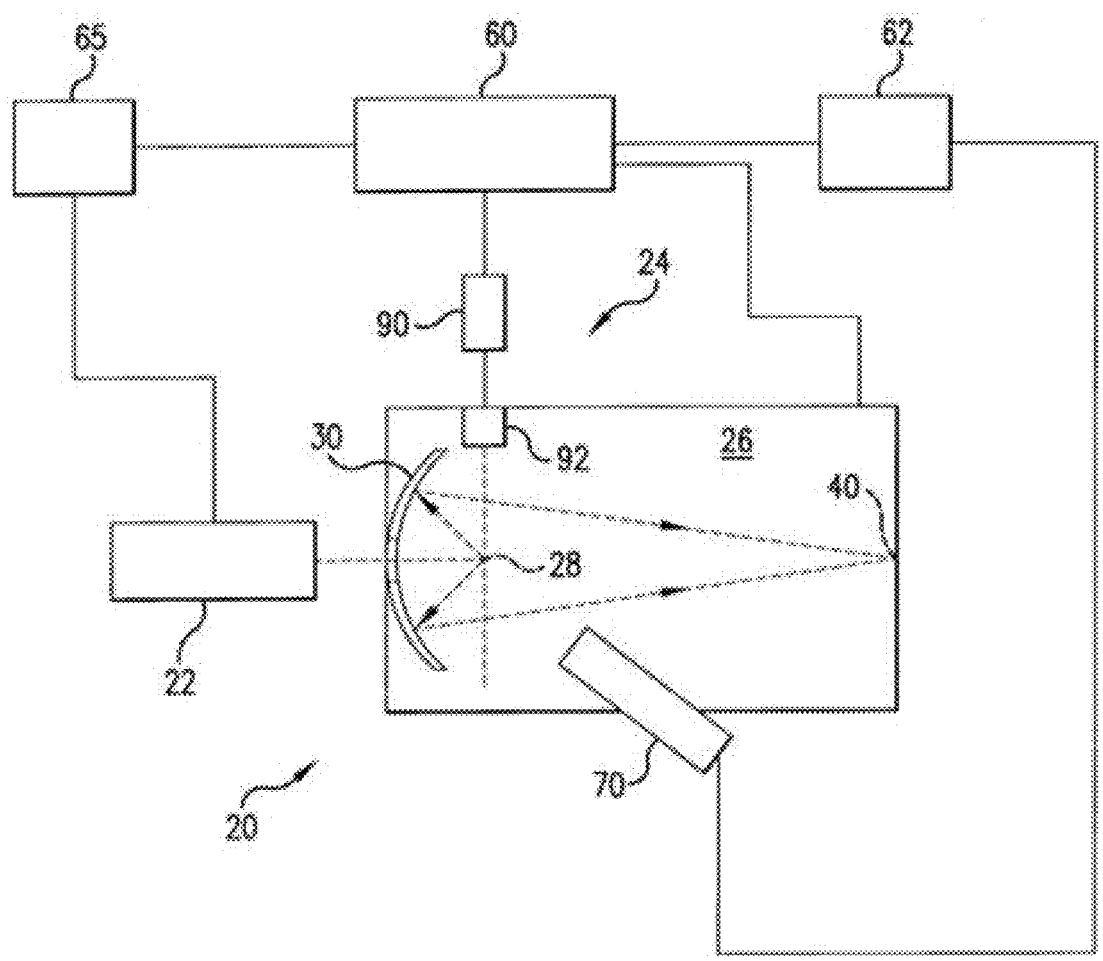
FIGS. 1 and 2 show a conventional EUV light generation device.
Figure 2:
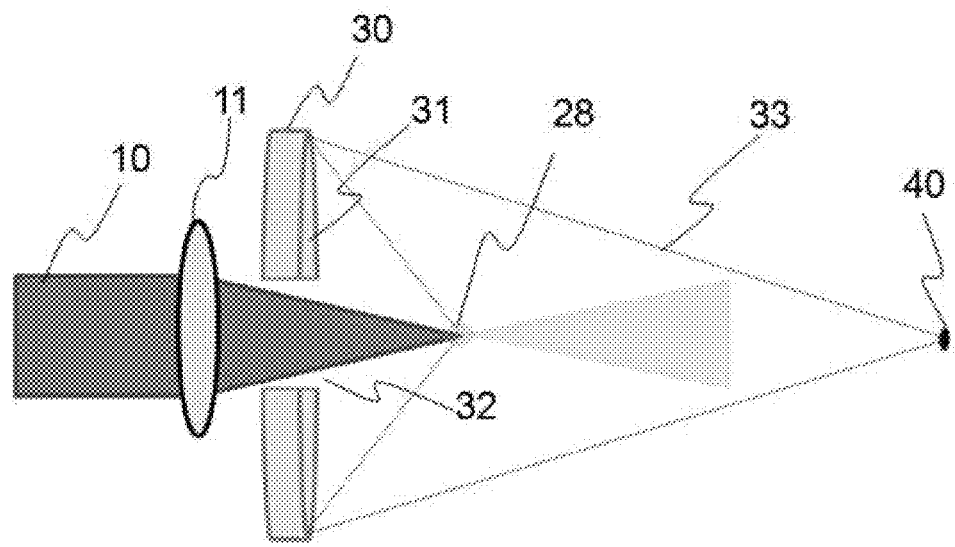

Hereinafter, embodiments of the present invention will be described with reference to the accompanying drawings. However, the embodiments of the present invention may be embodied in different forms and should not be construed as limited to the embodiments set forth herein but may be modified and variously implemented by those skilled in the art.

In the description, when it is said that one member is located "above" another member, it means that one member may come into contact with another member as well as yet another member may exist between the two members. In the description, the thicknesses of the lines or the sizes of the components shown in the drawing may be magnified for the clarity and convenience of the description.

Terms, such as the first, the second, the third, and the like may be used to describe various elements, but the elements should not be restricted by the terms. The terms are used to only distinguish one element from the other element. For example, a first element may be named a second element without departing from the scope of the present invention. Likewise, a second element may be named a first element. A term 'and/or' includes a combination of a plurality of relevant and described items or any one of a plurality of related and described items.

An expression referencing a singular value additionally refers to a corresponding expression of the plural number, unless explicitly limited otherwise by the context. In this application, terms, such as "comprise", "include", or 'have", are intended to designate those characteristics, numbers, steps, operations, elements, or parts which are described in the specification, or any combination of them that exist, and it should be understood that they do not preclude the possibility of the existence or possible addition of one or more additional characteristics, numbers, steps, operations, elements, or parts, or combinations thereof.

Further, if it is determined that the detailed explanation on the well known technology related to the present invention makes the scope of the present invention not clear, the explanation will be avoided for the brevity of the description.

Figure 3:
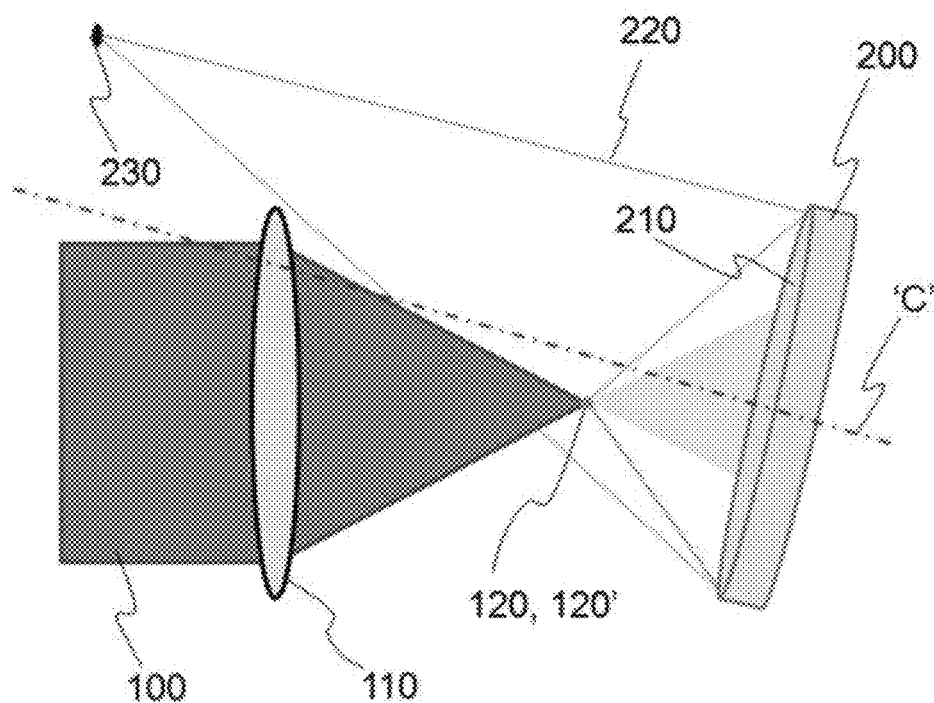
FIGS. 3 and 4 show an EUV light generation device according to the present invention.
Figure 4:
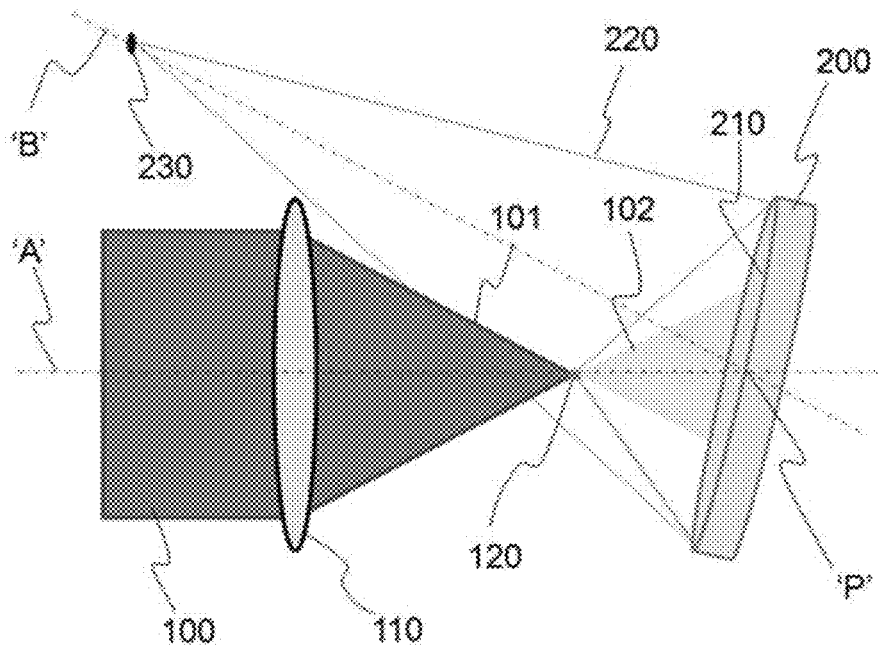
Figure 5:
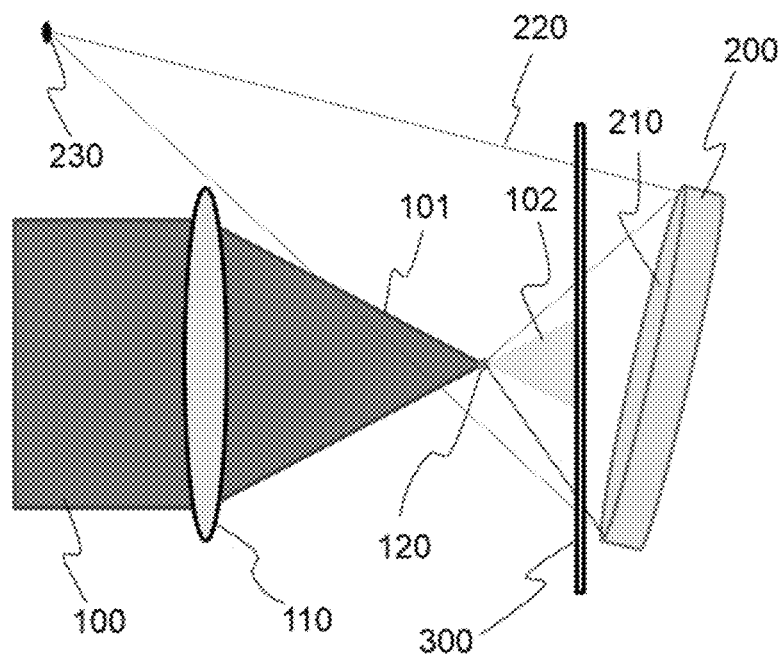
FIG. 5 shows the EUV light generation device according to the present invention that is provided with a protection plate.

FIGS. 3 to 5 show an EUV light generation device according to the present invention.

Referring to FIG. 3, the EUV light generation device according to the present invention includes a laser beam 100 irradiated on a droplet 120 and a focusing mirror 200 for focusing the EUV light generated through the plasma emitted by means of the irradiation of the laser beam on the droplet 120.

In this case, the focusing mirror 200 has a concaved operating surface 210 and a focusing point 230 formed at a position facing the operating surface 210, and the laser beam 100 and a focusing lens 110 for focusing the laser beam 100 are located at a position facing the operating surface 210 of the focusing mirror 200, so that the focusing point 230, the laser beam 100, and the focusing lens 110 are located on the positions facing the operating surface 210, that is, on one side of the operating surface 210.

In this case, the focusing mirror 200 is disposed on one side of the droplet 120, and the focusing lens 110 on the other side opposite to one side of the droplet 120. As a result, the laser beam 100 moves forward to the form of reduced light 101 in one direction and is thus focused. Accordingly, the laser beam 100 goes straight, passes through the focusing lens 110, and reaches the point at which the droplet 120 is located.

The laser beam 100 moving forward to the form of the reduced light 101 reaches a first focus 120' at which the droplet 120 is located, and through the reaction between the laser beam 100 and the droplet 120, accordingly, plasma emission is performed. The EUV light generated through the plasma emission is incident on the operating surface 210.

Referring to FIG. 4, if it is assumed that an optical axis connecting the center of the focusing lens 110 and the first focus 120' at which the droplet 120 is located is an A-axis, a point where the operating surface 210 and the A-axis meet each other is a contact point P, and a connection axis connecting the contact point P and the focusing point 230 is a B-axis, an angle between the A-axis and the B-axis is desirably in the range of 10 to 70°.

Referring to FIG. 5, after the laser beam 100 reaches the droplet 120 to the form of the reduced light 101 whose sectional size becomes gradually decreased by means of the focusing lens 110, the laser beam 100 is incident on the operating surface 210 to the form of enlarged light 102 whose sectional size becomes gradually increased. In some cases, the laser beam 100 having the form of the enlarged light 102 incident on the operating surface 210 may damage the operating surface 210.

To solve such a problem, according to the present invention, a protection plate 300 is disposed between the operating surface 210 and the first focus 120' at which the droplet 120 is located to protect the operating surface 210 from the laser beam 100, thereby preventing the operating surface 210 from being damaged due to the laser beam 100.

In this case, the protection plate 300 is constituted of multiple layers, and among the multiple layers, one layer includes a carbon nanotube (CNT) or graphene, while another layer includes one or more of zirconium (Zr), molybdenum (Mo), aluminum (Al), and niobium (Nb).

Referring back to FIG. 3, if it is assumed that a center axis vertical to the center point in area of the opposite surface to the operating surface 210 of the focusing mirror 200 is a C-axis, the operating surface 210 of the focusing mirror 200 has a non-spherical shape, so that the focusing point 230 generated through the operating surface 210 is located at one side of the C-axis.

In this case, the operating surface 210 is designed to have two focuses. The first focus 120' is designed so that it is formed at the position where the droplet 120 is located, and the focusing point 230 is designed so that it becomes a second focus. Accordingly, the operating surface 210 is designed to have the two focuses, while having the non-spherical shape.

As shown in FIG. 3, further, the focusing point 230 as the second focus and the first focus 120' are desirably located on both sides of the C-axis.

As mentioned above, the EUV light generation device according to the present invention can generate the EUV light with high brightness, while being small in size, thereby advantageously inducing accurate inspection in a blank inspection device.

In addition, the EUV light generation device according to the present invention can generate the EUV light with high brightness continuously, while being small in size.

The embodiments of the present invention have been disclosed in the specification and drawings. In the description of the present invention, special terms are used not to limit the present invention and the scope of the present invention as defined in claims, but just to explain the present invention. Therefore, persons skilled in the relevant art can appreciate that many modifications and variations are possible in light of the above teachings. It is therefore intended that the scope of the invention be limited not by this detailed description, but rather by the claims appended hereto.

What is claimed is:

1. An EUV light generation device comprising:
a laser beam (100) irradiated on a target material droplet (120); and
a focusing mirror (200) for focusing the EUV light generated through the plasma emitted by means of the irradiation of the laser beam (100) on the droplet (120), wherein the focusing mirror (200) has a concaved operating surface (210) and a focusing point (230) formed at a position facing the operating surface (210), and the laser beam (100) and a focusing lens (110) for focusing the laser beam (100) are located at the positions facing the operating surface (210) of the focusing mirror (200), so that the focusing point (230), the laser beam (100), and the focusing lens (110) are located on the positions facing the operating surface (210), that is, on one side of the operating surface (210).

2. The EUV light generation device according to claim 1, wherein the focusing mirror (200) is disposed on one side of the droplet (120), while the focusing lens (110) being disposed on the other side opposite to one side of the droplet (120), so that as the laser beam (100) moves forward to the form of reduced light (101) in one direction and is then focused, the laser beam (100) goes straight, passes through the focusing lens (100), and reaches a point at which the droplet (120) is located, and after the laser beam (100) reaches the droplet (120), plasma emission is performed through the reaction between the laser beam (100) and the droplet (120), so that the EUV light generated through the plasma emission is incident on the operating surface (210), reflected in the opposite direction to the incident direction through the operating surface (210), and focused on the focusing point (230).

3. The EUV light generation device according to claim 2, wherein if it is assumed that an optical axis connecting the center of the focusing lens (110) and a first focus 120' at which the droplet (120) is located is an A-axis, a point where the operating surface (210) and the A-axis meet each other is a contact point (P), and a connection axis connecting the contact point (P) and the focusing point (230) is a B-axis, an angle between the A-axis and the B-axis is in the range of 10 to 70°.

4. The EUV light generation device according to claim 2, wherein between the operating surface (210) and the first focus (120') at which the droplet (120) is located is disposed a protection plate 300 for protecting the operating surface (210) from the laser beam (100) to prevent the operating surface (210) from being damaged due to the laser beam (100) after the laser beam (100) reaches the droplet (120) to the form of the reduced light (101) whose sectional size becomes gradually decreased by means of the focusing lens (100) and is then incident on the operating surface (210) to the form of enlarged light (102) whose sectional size becomes gradually increased.

5. The EUV light generation device according to claim 4, wherein the protection plate (300) is constituted of multiple layers, and among the multiple layers, one layer comprises a carbon nanotube (CNT) or graphene, while another layer comprising one or more elements of zirconium (Zr), molybdenum (Mo), aluminum (Al), and niobium (Nb).

\* \* \* \* \*